(12) United States Patent
Park (10) Patent No.: US 7,148,730 B2
(45) Date of Patent: Dec. 12, 2006

(54) Z-STATE CIRCUIT FOR PHASE-LOCKED LOOPS

(75) Inventor: Sangbeom Park, Tracy, CA (US)

(73) Assignee: Ana Semiconductor, Tracy, CA (US)

( * ) Notice: Subject to any disclaimer, the term of this patent is extended or adjusted under 35 U.S.C. 154(b) by 74 days.

(21) Appl. No.: 11/023,683

(22) Filed: Dec. 27, 2004

(65) Prior Publication Data

US 2006/0139072 A1    Jun. 29, 2006

(51) Int. Cl.
*H03L 7/06* (2006.01)
(52) U.S. Cl. ...................... 327/149; 327/158
(58) Field of Classification Search ........... 327/147, 327/149, 150, 151, 153, 155, 156, 158, 159, 327/161; 331/17, 25; 375/375, 376

See application file for complete search history.

(56) References Cited

U.S. PATENT DOCUMENTS 6,972,604 B1 * 12/2005 Boerstler et al. ........... 327/156

* cited by examiner

*Primary Examiner*—Linh My Nguyen

(57) ABSTRACT

The four types of the Z-state circuits basically include a sensing gate, two stacked PMOS transistors, and a feedback line. The sensing gate senses a voltage at its input assuming no feedback is applied. Again, the corresponding output of two stacked PMOS transistors is assumed to be connected to the sensing input. Two stacked PMOS transistors generate a high impedance Z-state at its output according to the corresponding gate voltages. Therefore, the feedback line keeps sampling the output and feeding back the output voltage to the sensing input. Consequently, the feedback configuration provides the initial loop condition, which is affected by the midpoint voltage decided by the device aspect ratios of the sensing gate before normal operation starts.

20 Claims, 6 Drawing Sheets

Z-STATE CIRCUIT FOR PHASE-LOCKED LOOPS

FIELD OF THE INVENTION

The present invention relates to the field of z-state circuit for phase-locked loops and more particularly to very fast-locking phase-locked loops using z-state circuit.

BACKGROUND ART

Phase-looked loop is a vitally important device. Phase-looked loop is analog and mixed signal building block used extensively in communication, networks, digital systems, consumer electronics, computers, and any other fields that require frequency synthesizing and synchronization.

Figure 1:
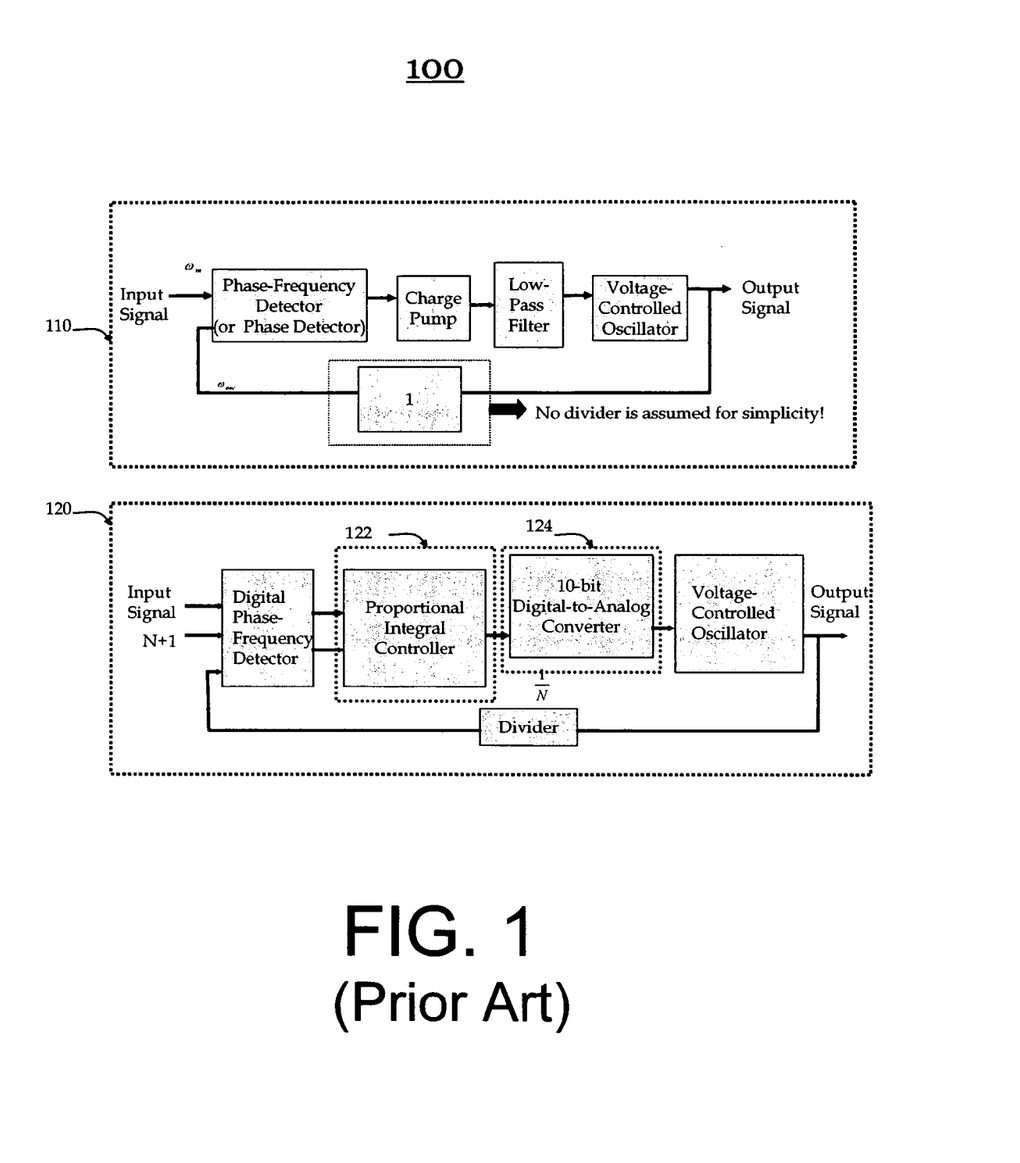
FIG. 1 illustrates a circuit diagram of two types of conventional phase-locked loops.

The phase-looked loop is a very versatile building block suitable for a variety of frequency synthesis, clock recovery, and synchronization applications. Prior Art FIG. 1 illustrates a basic architecture of two types of conventional phase-locked loops, which are a conventional phase-locked loop 110 and a conventional fast-locking phase-locked loop 120. The conventional phase-locked loop 110 typically consists of a phase-frequency detector (or phase detector), a charge-pump, a low-pass filter, a voltage-controlled oscillator, and a frequency divider in a loop. However, to understand phase-locked loops, phase-locked loops without any frequency dividers in a loop will be considered here. The phase-frequency detector is a block that has an output voltage with an average value proportional to the phase difference between the input signal and the output of the voltage-controlled oscillator. The charge-pump either injects the charge into the low-pass filter or subtracts the charge from the low-pass filter, depending on the outputs of the phase-frequency detector (or phase detector). Therefore, change in the low-pass filter's output voltage is used to drive the voltage-controlled oscillator. The negative feedback of the loop results in the output of the voltage-controlled oscillator being synchronized with the input signal. As a result, the phase-locked loop is in lock.

In the conventional phase-locked loop 110 of Prior Art FIG. 1, lock-in time is defined as the time that is required to attain lock from an initial loop condition. Assuming that the phase-locked loop bandwidth is fixed, the lock-in time is proportional to the initial difference frequency between the input signal frequency and the voltage-controlled oscillator's frequency as follows:

$$\frac{(\omega_{in} - \omega_{osc})^2}{\omega_0^3}$$

where $\omega_{in}$ is the input signal frequency, $\omega_{osc}$ is the voltage-controlled oscillator's frequency, and $\omega_o$ is the loop bandwidth. It should be noted that a loop bandwidth must be wide enough to obtain a fast lock-in time, unless the narrow bandwidth is inevitable to minimize output phase jitter due to external noise. If the loop bandwidth of a phase-locked loop is very narrow, the lock-in time is very slow. Most systems require a fast lock-in time even though the loop bandwidth is narrow. However, the conventional phase-locked loop 110 shown in Prior Art FIG. 1 has suffered from slow locking. Thus, time and power are unnecessarily consumed until the phase-locked loops are in lock. In addition, the conventional phase-locked loop 110 has taken a long time to be simulated and verified before they are fabricated since the simulation time of phase-locked loop circuits is absolutely proportional to time required the phase-locked loops to lock. This long simulation time adds additional cost and serious bottleneck to better design time to market. The conventional phase-locked loop 110 has also suffered from harmonic locking. Especially harmonic locking is that the phase-locked loop locks to harmonics of the input signal when a multiplier is used for the phase detector. Unfortunately the conventional phase-locked loop 110 of Prior Art FIG. 1 is very inefficient to implement in an integrated circuit, system-on-chip (SOC), monolithic circuit, or discrete circuits.

To overcome the drawbacks of the conventional phase-locked loop 110 of Prior Art FIG. 1, a conventional fast-locking phase-locked loop 120 of Prior Art FIG. 1 is illustrated. The conventional fast-locking phase-locked loop 120 consists of a digital phase-frequency detector, a proportional-integral controller 122, a 10-bit digital-to-analog converter 124, and a voltage-controlled oscillator. Unfortunately, the conventional fast-locking phase-locked loop is costly, complicated, and inefficient to implement in an integrated circuit (IC) or system-on-chip (SOC) because additional blocks such as the proportional-integral controller 122 and the 10-bit digital-to-analog converter 124 take much more chip area and consume much more power. Since there are much more functional blocks integrated on the same chip, the chip area of the conventional fast-locking phase-locked loop 120 is about three times as large as that of the conventional phase-locked loop 110. At the same time, complicated additional functional blocks in a loop make the stability analysis very difficult. The complexity increases the number of blocks that need to be designed and verified. This long time design and verification time adds additional cost and serious bottleneck to better design time to market, too. The conventional fast-locking phase-locked loop 120 might improve the lock-in time, but definitely results in bad productivity, higher cost, larger chip area, much more power consumption, and longer design time.

Thus, what is desperately needed is a phase-locked loop that can attain a very fast lock-in time and solve serious harmonic locking problems with a great improvement in productivity, cost, chip area, power consumption, and fast design time for much better time-to-market. The present invention satisfies these needs by providing Z-state circuits utilizing a small number of transistors.

SUMMARY OF THE INVENTION

The present invention provides four types of the Z-state circuits for phase-locked loops. The Z-state circuits enable any phase-locked loops to attain a very fast lock-in time. The simplest Z-state circuit of the present invention includes only six transistors. The basic architecture of the Z-state circuits basically consists of a sensing gate, two stacked PMOS transistors, and a feedback line. The sensing gate senses an initial voltage and two stacked PMOS transistors generate a high impedance Z-state at its output according to the corresponding gate input voltages. The feedback line keeps sampling the output and feeding back the output voltage to the sensing input.

Consequently, the feedback configuration provides the initial loop condition, which is affected by the midpoint voltage decided by the device aspect ratios of the sensing gate before normal operation of phase-locked loop starts. All Z-state circuits cause a substantial reduction in the difference between the initial loop condition and the locked condition in order to solve many drawbacks simultaneously. In addition, the present invention has four different embodiments with a great improvement in lock-in time, power consumption, design time, cost, and performance. One embodiment does not use power-down mode, whereas three embodiments utilize power-down mode.

BRIEF DESCRIPTION OF THE DRAWINGS

The accompanying drawings, which are incorporated in and form a part of this specification, illustrate four embodiments of the invention and, together with the description, serve to explain the principles of the invention.

Prior Art

DESCRIPTION OF THE PREFERRED EMBODIMENTS

In the following detailed description of the present invention, four types of the Z-state circuits, numerous specific details are set forth in order to provide a through understanding of the present invention. However, it will be obvious to one skilled in the art that the present invention may be practiced without these specific details. In other instances, well known methods, procedures, CMOS digital gates, components, and metal-oxide-semiconductor field-effect transistor (MOSFET) device physics have not been described in detail so as not to unnecessarily obscure aspects of the present invention.

Figure 2:
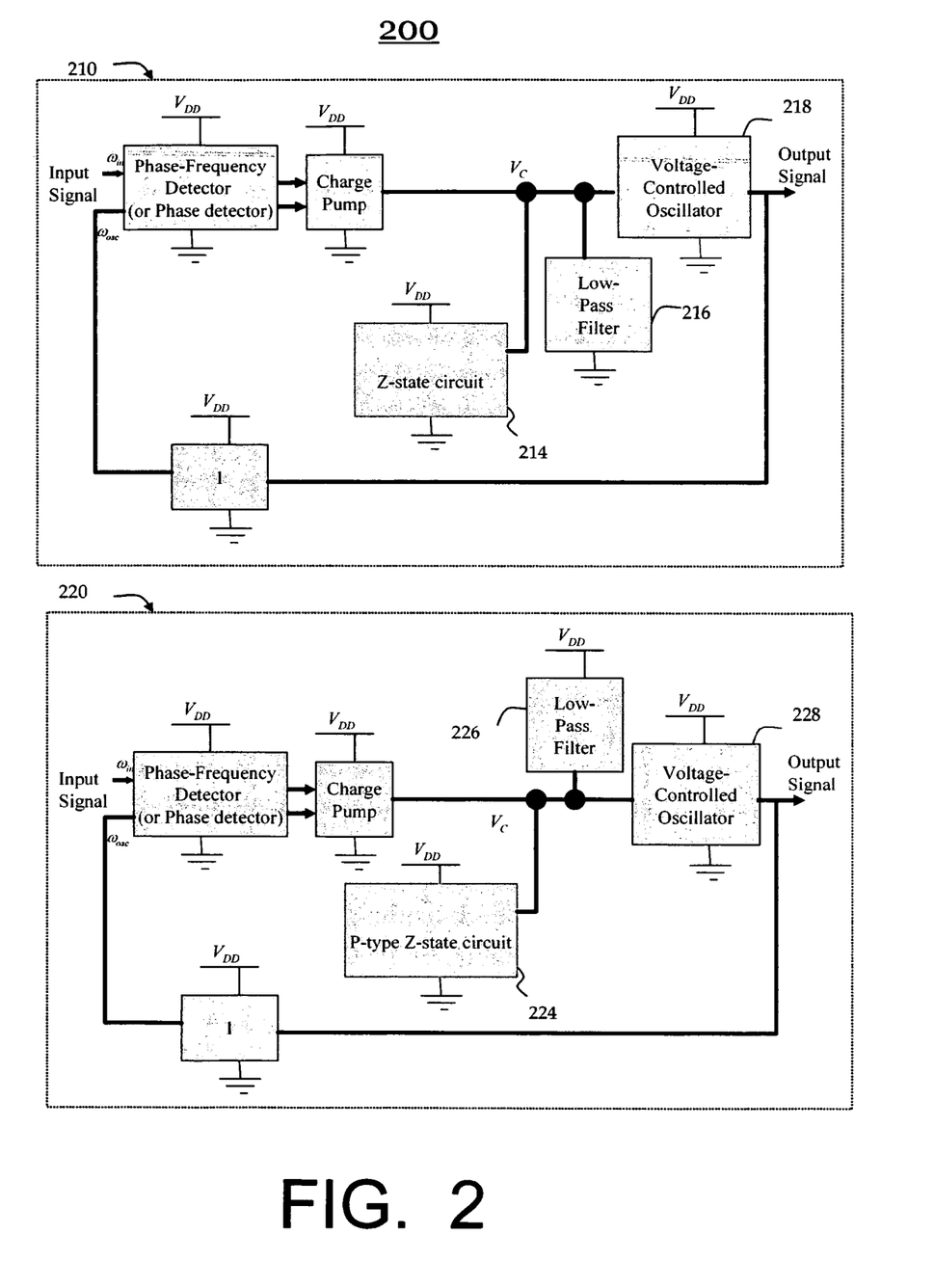
FIG. 2 illustrates a diagram of two types of Z-state circuits for phase-locked loops in accordance with the present invention.

FIG. 2 illustrates two types of the Z-state circuits for phase-locked loops in accordance with the present invention. One type of the Z-state circuits are applied for phase-locked loops driving a filter 216 connected between $V_C$ and ground, as seen in the phase-locked loop 210 shown in FIG. 2. The other type of the Z-state circuits called "p-type Z-state circuits" are applied for phase-locked loops driving a filter 226 connected between $V_{DD}$ and $V_C$, as seen in the phase-locked loop 220 shown in FIG. 2. To reduce the difference between the initial loop condition and the locked condition, the outputs of the Z-state circuit 214 and the p-type Z-state circuit 224 are coupled to the outputs of the filter 216 and the filter 226, respectively, as shown in FIG. 2. The phase-locked loop 210 not containing the Z-state circuit 214 represents all types of phase-locked loops driving a filter 216 connected between $V_C$ and ground without regard to the architecture of phase-locked loops because the applications of the Z-state circuit 214 is independent of architectures and types of phase-locked loops. The phase-locked loop 220 not containing the p-type Z-state circuit 224 represents all types of phase-locked loops driving a filter 226 connected between $V_{DD}$ and $V_C$ without regard to the architecture of phase-locked loops because the applications of the p-type Z-state circuit 224 is independent of architectures and types of phase-locked loops.

Figure 3:
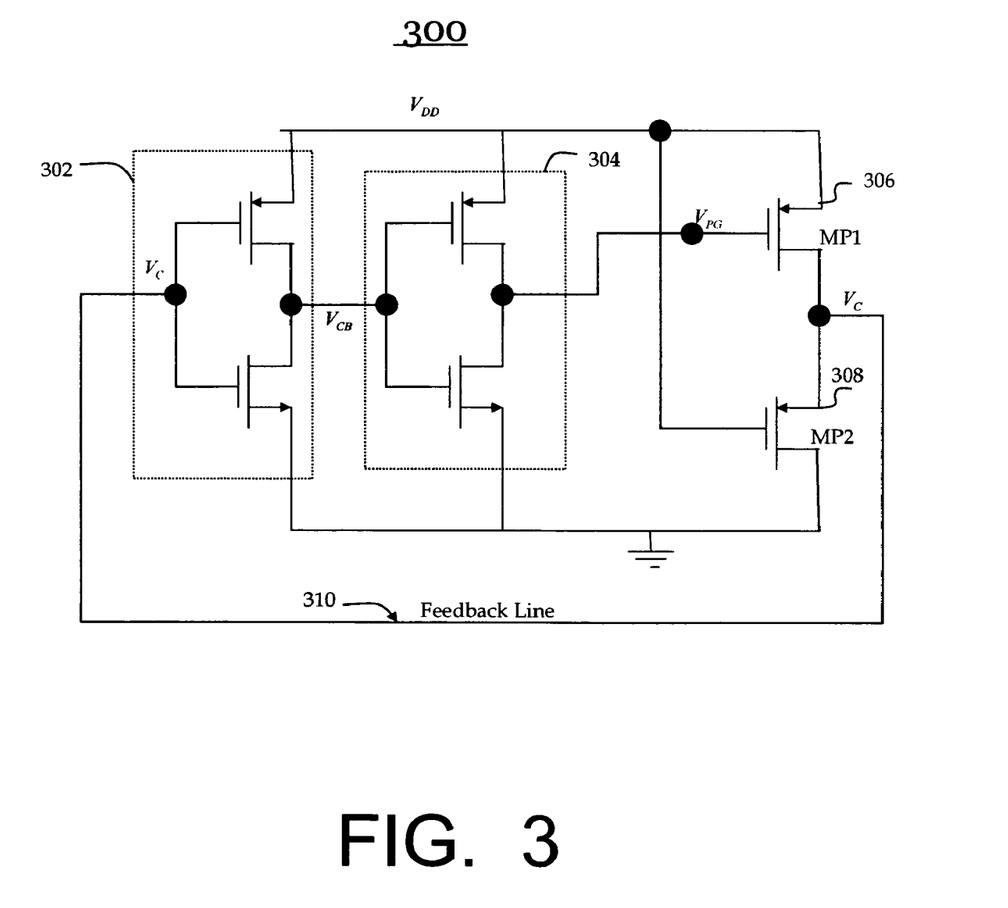
FIG. 3 illustrates a circuit diagram of a simple Z-state circuit according to the present invention.

FIG. 3 illustrates a circuit diagram of a simple Z-state circuit 300 according to the present invention. This simple Z-state circuit 300 is the simplest circuit among four embodiments of the invention. In practice, the simple Z-state circuit 300 is a feedback circuit that consists of a sensing inverter 302 (i.e., an odd number of sensing inverters), a second inverter 304, two stacked PMOS transistors 306 and 308, and a feedback line 310. In addition, it should be aware that the gate of the lower PMOS transistor 308 is connected to $V_{DD}$ in order to turn off the lower PMOS transistor 308 all the time. The simple Z-state circuit 300 is shown in FIG. 3, where $V_C$ is the output (=input) voltage with feedback 310 applied. First, assuming that feedback 310 is not present and thus the input and output are not tied together. In other words, the input and output without feedback 310 applied are the input of the sensing inverter 302 and output of two PMOS transistors 306 and 308, respectively. The sensing inverter 302 senses a voltage at its input. However, the input voltage is zero initially when the system is started. Since the input voltage of the sensing inverter 302 is zero, the output of the sensing inverter 302 is at $V_{DD}$. Thus, the output of the second inverter 304 is at ground to turn on the upper PMOS transistor 306, which provides an output pull-up path to $V_{DD}$ so that the output is at $V_{DD}$. Second, the output of two stacked PMOS transistors 306 and 308 is assumed to be connected to the input of the sensing inverter 302. Since the input voltage of the sensing inverter 302 is $V_{DD}$, the output voltage of the sensing inverter 302, $V_{CB}$, is zero and thus the output voltage of the second inverter 304, $V_{PG}$, is $V_{DD}$ to turn off the upper PMOS transistor 306. At this moment, two PMOS transistors 306 and 308 are off and the output is referred to as being in a high impedance Z-state. In other words, the output becomes a high impedance node that has no driving capability. However, in reality, it is noted that feedback 310 is applied in the simple Z-state circuit 300 of the present invention. Thus, the feedback keeps sampling the output and feeding back the output voltage to the sensing input. Consequently, the simple Z-state circuit 300 in the feedback configuration provides the initial loop condition, which is affected by the midpoint voltage decided by the device aspect ratios of the sensing inverter. As a result, a very small amount of current from the drain of the upper PMOS transistor 306 flows into a filter while no current flows into the source of the lower PMOS transistor 308.

In applications of the simple Z-state circuit 300 shown in FIG. 3, it is desirable to use the filter 216 of FIG. 2 connected to $V_C$ and ground for all kinds of phase-locked loops. It was just stated that the initial output voltage of the simple Z-state circuit is determined by the device aspect ratios of the sensing inverter 302. The midpoint voltage is a voltage where the input voltage and the output voltage of the inverter are equal in the voltage transfer characteristic. At the midpoint voltage, the transistors of the inverter operate in the saturation mode. This midpoint voltage of inverter is expressed as $$\frac{V_{DD} - V_{T_n} - |V_{T_p}|}{1 + \sqrt{\frac{K_n}{K_p}}} + V_{T_n} \text{ where } \frac{K_n}{K_p} = \frac{\mu_n C_{ox}\left(\frac{W}{L}\right)_n}{\mu_p C_{ox}\left(\frac{W}{L}\right)_p}$$

The initial output voltage of the simple Z-state circuit 300 will make the initial loop condition close to the locked condition of phase-locked loops. The difference between the initial loop condition and the locked condition is greatly reduced for any phase-locked loops containing the simple Z-state circuit 300.

It is a good idea to use a value for the midpoint voltage less than the voltage that makes the frequency of the voltage-controlled oscillator equal to the input signal's frequency. In order that the proper value of the midpoint voltage be chosen, the CMOS process variations usually must be considered. In addition, each bulk of two PMOS transistors 306 and 308 can be connected to its own N-well to obtain better immunity from substrate noise.

Figure 4:
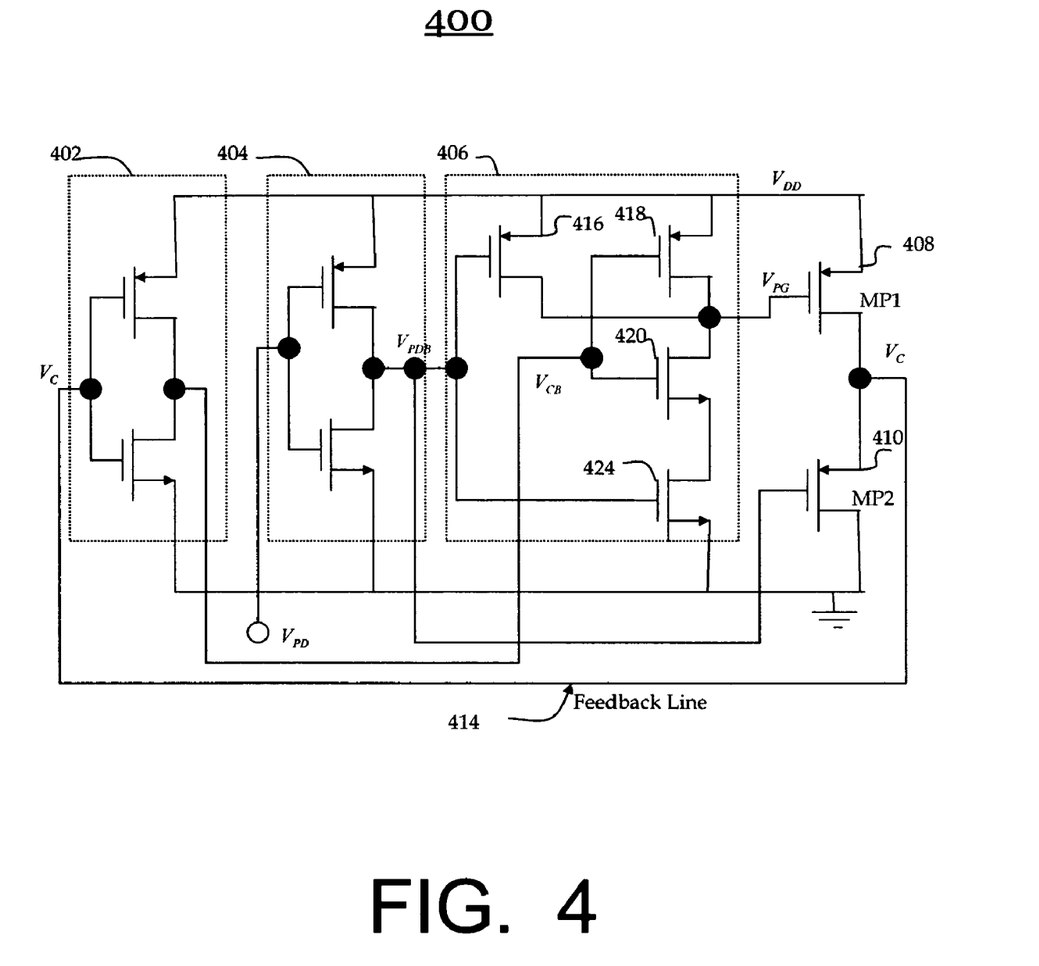
FIG. 4 illustrates a circuit diagram of a power-down enable Z-state circuit in accordance with the present invention.

FIG. 4 illustrates a circuit diagram of a power-down enable Z-state circuit 400 in accordance with the present invention. The power-down input voltage, $V_{PD}$, is defines as the input voltage for the power down mode. The power-down enable system is in power down mode when $V_{PD}$ is $V_{DD}$ and it is in normal mode when $V_{PD}$ is zero. The power-down enable Z-state circuit 400 is a feedback circuit that consists of a sensing inverter 402 (i.e., an odd number of sensing inverters), a power-down inverter 404, a NAND gate 406, two stacked PMOS transistors 408 and 410, and a feedback line 414. The power-down enable Z-state circuit 400 is shown in FIG. 4, where $V_C$ is the output (=input) voltage with feedback applied. First, it is assumed that feedback 414 is not present and thus the input and output are not the same. In other words, the input and output without feedback 414 applied are the input of the sensing inverter 402 and output of two PMOS transistors 408 and 410, respectively. The sensing inverter 402 senses a voltage at its input when the circuit mode changes from power-down mode to normal mode after its start-up. Since the input voltage of the power-down inverter 404, $V_{PD}$, becomes zero during normal mode, the output voltage of the power-down inverter 404, $V_{PDB}$, is $V_{DD}$. At the same time, since the input of the sensing inverter 402 initially is at ground, the output of the sensing inverter 402 becomes at $V_{DD}$. It is noted that since the gate voltage of the lower PMOS transistor 410, $V_{PDB}$, is $V_{DD}$, the lower PMOS transistor 410 is off during normal mode. With two input voltages, $V_{PDB}=V_{DD}$ and $VCB=V_{DD}$, the output of the CMOS NAND gate 406 is at ground to turn on the upper PMOS transistor 408, which provides an output pull-up path to $V_{DD}$ so that the output is at $V_{DD}$. Second, the output of two stacked PMOS transistors 408 and 410 is assumed to be connected to the input of the sensing inverter 402. Since the input voltage of the sensing inverter 402 is $V_{DD}$, the output voltage of the sensing inverter 402, $V_{CB}$, is zero. With two input voltages, $V_{PDB}=V_{DD}$ and $V_{CB}=0$, the output of the CMOS NAND gate 406 is at $V_{DD}$ to turn off the upper PMOS transistor 408. At this moment, two PMOS transistors 408 and 410 are off and the output is referred to as being in a high impedance Z-state. Thus, the output becomes a high impedance node that has no driving capability. However, in reality, it is noted that feedback 414 is applied in the power-down enable Z-state circuit 400 of the present invention. Thus, the feedback line keeps sampling the output and feeding back the output voltage to the sensing input. Consequently, the power-down enable Z-state circuit 400 in the feedback configuration provides the initial $V_C$, which is the midpoint voltage decided by the device aspect ratios of the sensing inverter 402. As a result, a very small amount of current from the drain of the upper PMOS transistor 408 flows into a filter while no current flows into the source of the lower PMOS transistor 410.

For application of the power-down enable Z-state circuit 400 shown in FIG. 4, it is desirable to use the filter 216 of FIG. 2 connected to $V_C$ and ground for any phase-locked loops. Also, the initial $V_C$ is defined to be approximately the midpoint voltage of the sensing inverter 402.

Also, as seen in the CMOS NAND gate 406 shown in FIG. 4, the gate terminal of the left PMOS transistor 416 is coupled to the gate terminal of the lower NMOS transistor 424, and the gate terminal of the right PMOS transistor 418 is coupled to the gate terminal of the upper NMOS transistor 420, with these device pair connections serving as inputs to the CMOS NAND gate circuit 406. The gate terminal of the left PMOS transistor 416 and the lower NMOS transistor 424 serves as the inverting power-down input and the gate terminal of the right PMOS transistor 418 and the upper NMOS transistor 420 serves as the logical input, as shown in FIG. 4. Those skilled in the art will recognize that with minor modifications, these input schemes may be reversed with the gate terminal of the left PMOS transistor 416 and the lower NMOS transistor 424 serving as the logical input and the gate terminal of the right PMOS transistor 418 and the upper NMOS transistor 420 serving as the inverting power-down input. In addition, those skilled in the art will recognize that with minor modifications, the coupling scheme may be reversed with the gate terminal of the left PMOS transistor 416 being coupled to the gate terminal of the upper NMOS transistor 420, and the gate terminal of the right PMOS transistor 418 being coupled to the gate terminal of the lower NMOS transistor 424. Hence, the reversed coupling scheme allows following input schemes: 1. The gate terminal of the left PMOS transistor 416 and the upper NMOS transistor 420 serves as the inverting power-down input and the gate terminal of the right PMOS transistor 418 and the lower NMOS transistor 424 serves as the logical input. 2. The gate terminal of the left PMOS transistor 416 and the upper NMOS transistor 420 serves as the logical input and the gate terminal of the right PMOS transistor 418 and the lower NMOS transistor 424 serves as the inverting power-down input.

The initial output voltage of the power-down enable Z-state circuit 400 will make the initial loop condition close to the locked condition of phase-locked loops. The difference between the initial loop condition and the locked condition is greatly reduced for any phase-locked loops containing the power-down enable Z-state circuit 400. In design of the power-down enable Z-state circuit of FIG. 4, it is also desirable to use a value for the midpoint voltage less than the voltage that makes the frequency of the voltage-controlled oscillator equal to the input signal's frequency. As mentioned earlier, the CMOS process variations usually must be considered so that the proper value of the midpoint voltage is chosen for the power-down enable Z-state circuit of FIG. 4. In addition, each bulk of two PMOS transistors 408 and 410 can be connected to its own N-well to obtain better immunity from substrate noise.

Since the power-down input voltage, $V_{PD}$, becomes $V_{DD}$ for power-down mode, the output voltage of the power-down inverter, $V_{PDB}$, is zero. In other words, the lower PMOS transistor 410 is on during power-down mode and thus provides an output pull-down path to ground. Thus, $V_C$ of the power-down enable Z-state circuit 400 is zero during power-down mode. Zero dc volt at $V_C$ ensures that no current flows into the circuits during power-down mode. At this point, to realize this power-down mode, one should use the filter 216 connected to $V_C$ and ground, as shown in FIG. 2. The present invention offers the above advantages by simply providing a power-down enable z-state circuit utilizing only ten transistors that all require smaller sizes of the lengths and widths of the transistor.

Figure 5:
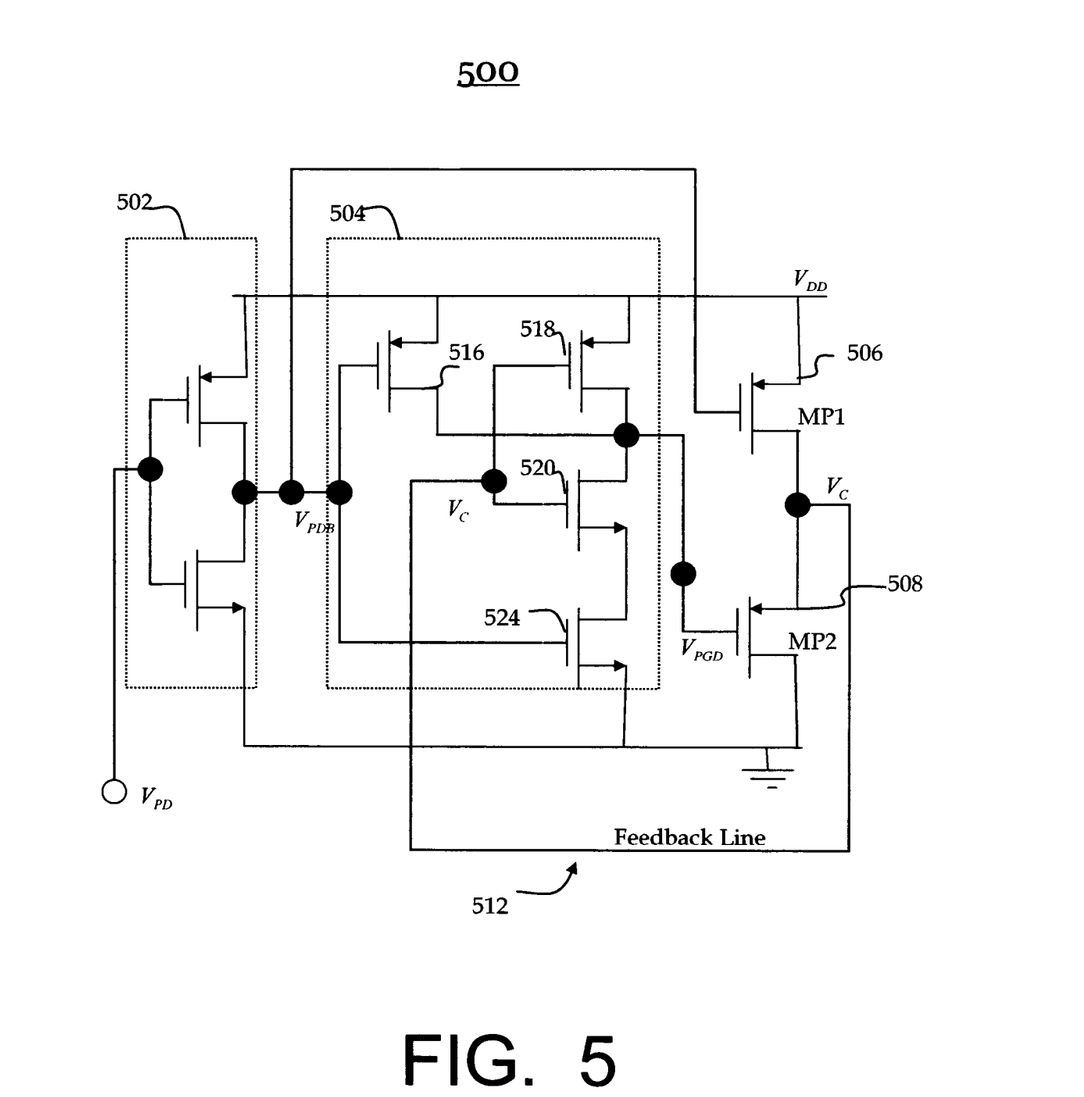
FIG. 5 illustrates a circuit diagram of a p-type power-down enable Z-state circuit according to the present invention.

FIG. 5 illustrates a circuit diagram of a p-type power-down enable Z-state circuit 500 according to the present invention. This p-type power-down enable Z-state circuit 500 is the other power-down enable embodiment of the invention. The power-down input voltage, $V_{PD}$, is defines as the input voltage for the p-type power down mode as well as for the power down mode. For simplicity, p-type power down mode can be also termed the power-down mode, too.

The p-type power-down enable Z-state circuit 500 is a feedback circuit that consists of a power-down inverter 502 (i.e., an odd number of power-down inverters), a sensing NAND gate 504, two stacked PMOS transistors 506 and 508, and a feedback line 512. It is noted here that a two-input CMOS NAND gate 504 has the same midpoint voltage as an inverter since the two-input CMOS NAND gate can be used as an enabling inverter with one input serving as an active high enable input and the other used as the sensing input. Assuming the enable input voltage is $V_{DD}$, the midpoint voltage of the sensing CMOS NAND gate 504 is a voltage where the sensing input voltage and the output voltage of the CMOS NAND gate are equal in the voltage transfer characteristic. Thus, the midpoint voltage is decided by the device aspect ratios of the CMOS NAND gate 504.

The p-type power-down enable Z-state circuit 500 shown in FIG. 5, where $V_C$ is the output (=input) voltage with feedback 512 applied. First, it is assumed that feedback 512 is open and thus the sensing input and output are not connected together. In other words, the input and output without feedback 512 are the sensing input of the sensing NAND gate 504 and output of two PMOS transistors 506 and 508, respectively. The sensing NAND gate 504 senses $V_{DD}$ at its sensing input when the circuit mode changes from power-down mode to normal mode after its start-up. The reason why the sensing input of the sensing NAND gate 504 is at $V_{DD}$ is that the output voltage of the power-down inverter 502, $V_{PDB}$, was zero, which turned on the upper PMOS transistor 506 and thus provided an output pull-up path to $V_{DD}$ during previous power-down mode. Since the power-down input voltage, $V_{PD}$, becomes zero during normal mode, the output voltage of the power-down inverter, $V_{PDB}$, is $V_{DD}$. In other words, the gate voltage of the upper PMOS transistor 506, $V_{PDB}$, is $V_{DD}$ to turn off the upper PMOS transistor 506 during normal mode. Since the active high enable input and sensing input voltage of the sensing NAND gate 504 are $V_{DD}$, the output of the sensing NAND gate 504 is at ground to turn on the lower PMOS transistor 508, which provides an output pull-down path to ground so that the output is at ground. Second, the output of two stacked PMOS transistors 506 and 508 is assumed to be connected to the sensing input of the sensing CMOS NAND gate 504. Since the sensing input voltage of the sensing CMOS NAND gate 504 becomes zero and the other enable input voltage, $V_{PDB}$, is $V_{DD}$, the output of the CMOS NAND gate 504 is at $V_{DD}$ to turn off the lower PMOS transistor 508. At this moment, two PMOS transistors 506 and 508 are off and the output is referred to as being in a high impedance Z-state. Thus, the output of two PMOS transistors 506 and 508 becomes a high impedance node that has no driving capability. However, in reality, it is noted that feedback 512 is applied in the present invention. Therefore, the feedback line keeps sampling the output and feeding back the output voltage to the sensing input. Finally, the p-type power-down enable Z-state circuit 500 in the feedback configuration provides the initial $V_C$, which is the midpoint voltage decided by the device aspect ratios of the sensing CMOS NAND gate 504. As a result, a very small amount of current flows out of a filter and flows into the source of the lower PMOS transistor 508 while no current flows out of the drain of the upper PMOS transistor 506.

For application of the p-type power-down enable Z-state circuit 500 shown in FIG. 5, it is desirable to use the filter 226 of FIG. 2 connected to $V_{DD}$ and $V_C$ for any phase-locked loops. The initial $V_C$ is approximately the midpoint voltage of the sensing CMOS NAND gate. This initial output voltage of the p-type power-down enable Z-state circuit 500 will make the initial loop condition close to the locked condition of phase-locked loops. The difference between the initial loop condition and the locked condition is greatly reduced for any phase-locked loops containing the p-type power-down enable Z-state circuit 500.

Also, as seen in the sensing CMOS NAND gate 504 shown in FIG. 5, the gate terminal of the left PMOS transistor 516 is coupled to the gate terminal of the lower NMOS transistor 524, and the gate terminal of the right PMOS transistor 518 is coupled to the gate terminal of the upper NMOS transistor 520, with these device pair connections serving as inputs to the sensing CMOS NAND gate circuit 504. The gate terminal of the left PMOS transistor 516 and the lower NMOS transistor 524 serves as the inverting power-down input and the gate terminal of the right PMOS transistor 518 and the upper NMOS transistor 520 serves as the sensing input, as shown in FIG. 5. Those skilled in the art will recognize that with minor modifications, these input schemes may be reversed with the gate terminal of the left PMOS transistor 516 and the lower NMOS transistor 524 serving as the sensing input and the gate terminal of the right PMOS transistor 518 and the upper NMOS transistor 520 serving as the inverting power-down input. In addition, those skilled in the art will recognize that with minor modifications, the coupling scheme may be reversed with the gate terminal of the left PMOS transistor 516 being coupled to the gate terminal of the upper NMOS transistor 520, and the gate terminal of the right PMOS transistor 518 being coupled to the gate terminal of the lower NMOS transistor 524. Hence, the reversed coupling scheme allows following input schemes: 1. The gate terminal of the left PMOS transistor 516 and the upper NMOS transistor 520 serves as the inverting power-down input and the gate terminal of the right PMOS transistor 518 and the lower NMOS transistor 524 serves as the sensing input. 2. The gate terminal of the left PMOS transistor 516 and the upper NMOS transistor 520 serves as the sensing input and the gate terminal of the right PMOS transistor 518 and the lower NMOS transistor 524 serves as the inverting power-down input.

In design of the p-type power-down enable Z-state circuit 500 shown in FIG. 5, it is also desirable to use a value for the midpoint voltage greater than the voltage that makes the frequency of the voltage-controlled oscillator equal to the input signal's frequency. The CMOS process variations usually must be considered so that the proper value of the midpoint voltage is chosen for the p-type power-down enable Z-state circuit 500. In addition, each bulk of two PMOS transistors 506 and 508 can be connected to its own N-well to obtain better immunity from substrate noise.

The p-type power-down enable system is in power down mode when the power-down input voltage, $V_{PD}$ is $V_{DD}$ and it is in normal mode when $V_{PD}$ is zero. If $V_{PD}$ becomes $V_{DD}$ during power-down mode, the output voltage of the power-down inverter, $V_{PDB}$, is zero, which turns on upper PMOS transistor during power-down mode and thus provides an output pull-up path to $V_{DD}$. Thus, $V_C$ of the p-type power-down enable Z-state circuit 500 is $V_{DD}$. $V_C=V_{DD}$ ensures that no current flows into the circuits during power-down mode. At this point, to realize this power-down mode for all building blocks, one should use the filter 226 connected to $V_{DD}$ and $V_C$. For this configuration shown in FIG. 5, $V_C$ must be $V_{DD}$ during power-down mode to ensure that no current flows into the circuits. On the contrary, it was stated earlier that $V_C$ must be zero when power-down mode occurs in FIG. 4.

Figure 6:
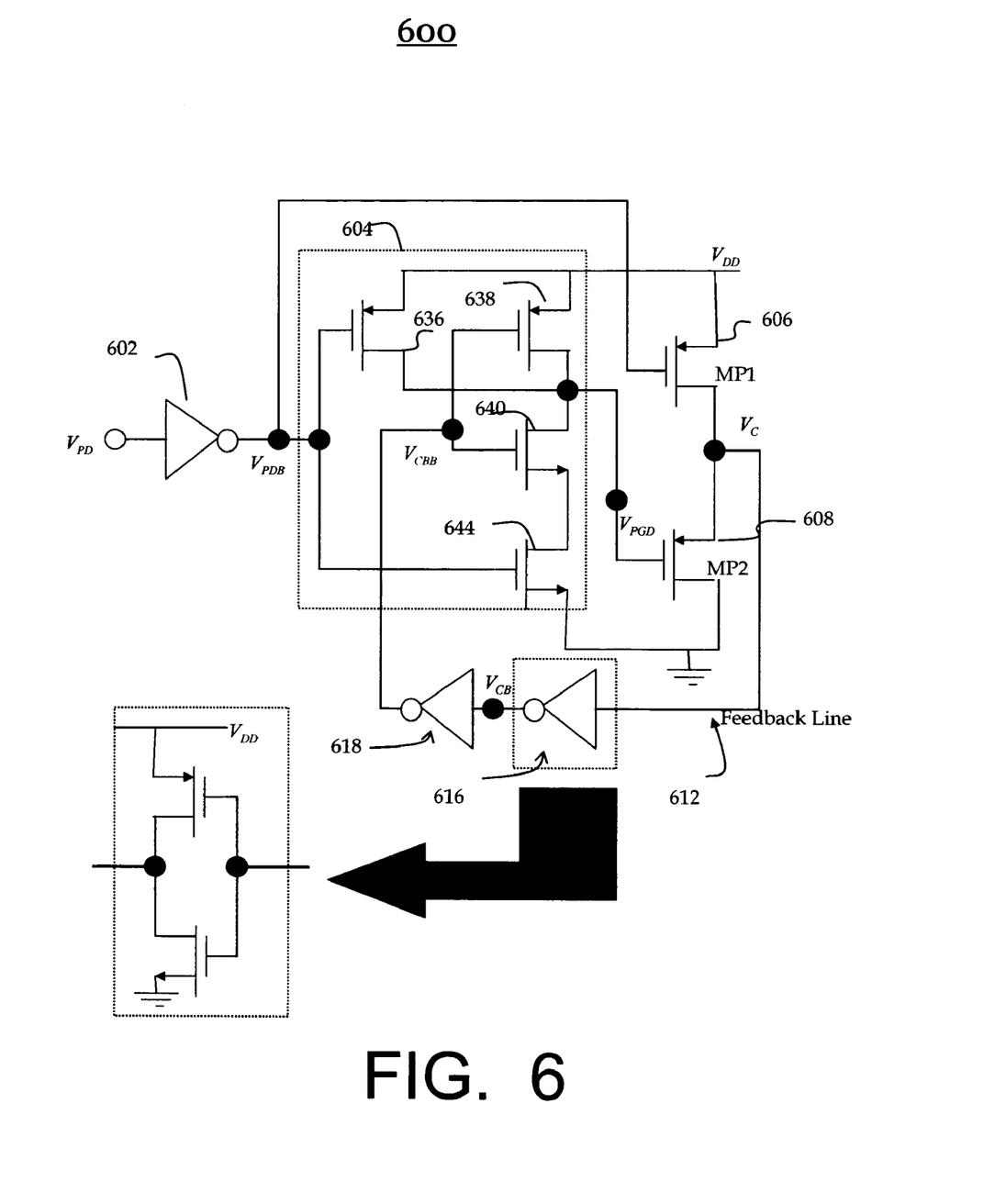
FIG. 6 illustrates a circuit diagram of a modified p-type power-down enable Z-state circuit in accordance with the present invention.

FIG. 6 illustrates a circuit diagram of a modified p-type power-down enable Z-state circuit 600 in accordance with the present invention. The p-type power-down enable Z-state circuit 600 shown in FIG. 6 is a feedback circuit that consists of a power-down inverter 602 (i.e., an odd number of power-down inverters), a NAND gate 604, two sensing inverters 616 and 618 (i.e., an even number of sensing inverters), two stacked PMOS transistors 606 and 608, and a feedback line 612. This circuit 600 is a modification of the circuit described in FIG. 5 and has two other additional inverters compared to FIG. 5.

The modified p-type power-down enable Z-state circuit 600 shown in FIG. 6, where $V_C$ is the output (=input) voltage with feedback 612 applied. First, to understand the operation of the modified p-type power-down enable Z-state circuit 600, it is necessary to make the assumption that feedback 612 is open and thus the input and output are not connected each other. The first sensing inverter 616 senses at $V_{DD}$ its sensing input when the circuit mode changes from power-down mode to normal mode after its start-up. The reason why the sensing input of the first sensing inverter 616 is at $V_{DD}$ is that the output voltage of the power-down inverter 602, $V_{PDB}$, was zero, which turned on the upper PMOS transistor 606 and thus provided an output pull-up path to $V_{DD}$ during previous power-down mode. Since the power-down input voltage, $V_{PD}$, becomes zero during normal mode, the output voltage of the power-down inverter 602, $V_{PDB}$, is $V_{DD}$. Thus, the gate voltage of the upper PMOS transistor 606, $V_{PDB}$, is $V_{DD}$ to turn off the upper PMOS transistor 606 during normal mode. At the same time, since the input of the first sensing inverter 616 is at $V_{DD}$, the output voltage of the second sensing inverter 618, $V_{CBB}$, is $V_{DD}$. With two input voltages, $V_{PDB}=V_{DD}$ and $V_{CBB}=V_{DD}$, the output of the CMOS NAND gate 604 is at ground to turn on the lower PMOS transistor 608, which provides an output pull-down path to ground so that the output is at ground. Second, the output of two stacked PMOS transistors 606 and 608 is assumed to be connected to the input of the first sensing inverter 616. Since the input voltage of the first sensing inverter 616 becomes zero, the output voltage of the second sensing inverter 618, $V_{CBB}$, is zero. Also, the output voltage of the power-down inverter 602, $V_{PDB}$, is $V_{DD}$ during normal mode. With two input voltages, $V_{PDB}=V_{DD}$ and $V_{CBB}=0$, the output of the CMOS NAND gate 604 is at $V_{DD}$ to turn off the lower PMOS transistor 608. At this moment, two PMOS transistors 606 and 608 are off and the output is referred to as being in a high impedance Z-state. However, in reality, it is noted that feedback 612 is applied in the present invention. Therefore, the feedback line keeps sampling the output and feeding back the output voltage to the sensing input. Finally, the modified p-type power-down enable Z-state circuit 600 in the feedback configuration provides the initial $V_C$, which is approximately the midpoint voltage decided by the device aspect ratios of the first sensing inverter 616. It should be noted that the operation and principles of the circuit shown in FIG. 6 are the same as those of the circuit shown in FIG. 5. However, the difference to note here in FIG. 6 is to utilize an inverter to sense the output voltage, $V_C$. In other words, the NAND gate 504 shown in FIG. 5 was used as a sensing gate, but the NAND gate 604 shown in FIG. 6 does not function as a sensing gate any more. As a result, a very small amount of current flows out of a filter and flows into the source of the lower PMOS transistor 608 while no current flows out of the drain of the upper PMOS transistor 606.

For application of the modified p-type power-down enable Z-state circuit 600 shown in FIG. 6, it is desirable to use the filter 226 of FIG. 2 connected to $V_{DD}$ and $V_C$ for any phase-locked loops. The initial output voltage of the modified p-type power-down enable Z-state circuit 600 will make the initial loop condition close to the locked condition of phase-locked loops. The difference between the initial loop condition and the locked condition is greatly reduced for any phase-locked loops containing the modified p-type power-down enable Z-state circuit 600.

Also, as seen in the CMOS NAND gate 604 shown in FIG. 6, the gate terminal of the left PMOS transistor 636 is coupled to the gate terminal of the lower NMOS transistor 644, and the gate terminal of the right PMOS transistor 638 is coupled to the gate terminal of the upper NMOS transistor 640, with these device pair connections serving as inputs to the CMOS NAND gate circuit 604. The gate terminal of the left PMOS transistor 636 and the lower NMOS transistor 644 serves as the inverting power-down input and the gate terminal of the right PMOS transistor 638 and the upper NMOS transistor 640 serves as the logical input, as shown in FIG. 6. Those skilled in the art will recognize that with minor modifications, these input schemes may be reversed with the gate terminal of the left PMOS transistor 636 and the lower NMOS transistor 644 serving as the logical input and the gate terminal of the right PMOS transistor 638 and the upper NMOS transistor 640 serving as the inverting power-down input. In addition, those skilled in the art will recognize that with minor modifications, the coupling scheme may be reversed with the gate terminal of the left PMOS transistor 636 being coupled to the gate terminal of the upper NMOS transistor 640, and the gate terminal of the right PMOS transistor 638 being coupled to the gate terminal of the lower NMOS transistor 644. Hence, the reversed coupling scheme allows following input schemes: 1. The gate terminal of the left PMOS transistor 636 and the upper NMOS transistor 640 serves as the inverting power-down input and the gate terminal of the right PMOS transistor 638 and the lower NMOS transistor 644 serves as the logical input. 2. The gate terminal of the left PMOS transistor 636 and the upper NMOS transistor 640 serves as the logical input and the gate terminal of the right PMOS transistor 638 and the lower NMOS transistor 644 serves as the inverting power-down input.

For design of the modified p-type power-down enable Z-state circuit 600 shown in FIG. 6, it is also desirable to use a value for the midpoint voltage greater than the voltage that makes the frequency of the voltage-controlled oscillator equal to the input signal's frequency. As mentioned before, the CMOS process variations usually must be considered so that the proper value of the midpoint voltage is chosen for the modified p-type power-down enable Z-state circuit shown in FIG. 6. In addition, each bulk of two PMOS transistors 606 and 608 can be connected to its own N-well to obtain better immunity from substrate noise.

The p-type power down mode of FIG. 6 is the same as that of FIG. 5. Thus, $V_C=V_{DD}$ ensures that no current flows into the circuits during power-down mode. At this point, to realize this power-down mode for all building blocks, one should use the filter 226 of FIG. 2 connected to $V_{DD}$ and $V_C$.

The present invention offers the above advantages by simply providing a modified p-type power-down enable Z-state circuit 600 utilizing only twelve transistors that all require smaller sizes of the lengths and widths of the transistor.

In summary, the Z-state circuits 300 and 400 within the phase-locked loop systems 210 and the Z-state circuits 500 and 600 within the phase-locked loop systems 220 make the initial loop condition of phase-locked loop closer to its locked condition so that any phase-locked loops are quickly locked. The phase-locked loop including four types of the Z-state circuits 300, 400, 500, and 600 have the following advantages: a very fast lock-in time of phase-locked loops, an elimination of harmonic locking, a great reduction in power and time consumption until lock, a significant reduction in design time for much better time-to-market, and a much higher performance.

The Z-state circuit 214 shown in FIG. 2 represents the simple Z-state circuit 300 and the power-down enable Z-state circuit 400, as shown in FIG. 3 and FIG. 4, respectively. Also, the p-type Z-state circuit 224 shown in FIG. 2 represents the p-type power-down enable Z-state circuit 500 and the modified p-type power-down enable Z-state circuit 600, as shown in FIG. 5 and FIG. 6, respectively. It is noted that SPICE is used for the simulation of phase-locked loops. The conventional phase-locked loop 110 and the phase-locked loop 210 including the Z-state circuit 214 of the invention are simulated using the same blocks. As a result, the total simulation time of the conventional phase-locked loop 110 is 20 hours and that of the phase-locked loop 210 including the Z-state circuit 214 of the invention is 2 hours. It also takes about 2 hours to simulate the phase-locked loop 220 including the p-type Z-state circuit 224. This improvement can be accomplished by simply inserting one of any Z-state circuits into any conventional phase-locked loops, and the simulation time has been reduced by a factor of 10. It should be also noted that the same time step has been used for the SPICE simulation in order to accurately measure and compare the simulation time of all circuits.

The present invention, four types of the Z-state circuits, simply utilizes a Z-state circuit rather than using complicated proportional integral controller 122 and 10-bit digital-to-analog converter 124 in order to greatly reduce the cost, chip area, power, lock-in time, and complexity. A cost-effective Z-state circuit is simply inserted into any conventional phase-locked loops. The Z-state circuits of the present invention are very efficient to implement in integrated circuit (IC), system-on-chip (SOC), monolithic circuit, or discrete circuit. While the present invention has been described in particular embodiments, it should be appreciated that the present invention should not be construed as being limited by such embodiments, but rather construed according to the claims below.

What is claimed is:

1. A Z-state circuit for making any phase-locked loop very efficient, comprising:
    a feedback line connected with the output and input of the Z-state circuit coupled to an output of a filter within a phase-locked loop;
    a sensing inverter for sensing a voltage at the output, comparing with the midpoint voltage decided by the device aspect ratios of the sensing inverter, and providing its output;
    a two-input CMOS NAND gate for being used as an enabling inverter with one input serving as an inverting power-down input and the other used as the logical input; and
    two stacked PMOS transistors for generating a high impedance Z-state at its output according to the corresponding gate voltages.

2. The circuit as recited in claim 1 wherein an odd number of power-down inverters are further added to turn off all transistors and CMOS gates so that no current flows into the circuit during power-down mode.

3. The circuit as recited in claim 1 wherein the sensing inverter is an inverter.

4. The circuit as recited in claim 1 wherein the sensing inverter is a comparator.

5. The circuit as recited in claim 1 wherein the sensing inverter is an operational amplifier.

6. The circuit as recited in claim 1 wherein the sensing inverter is CMOS NAND gate since the two-input CMOS NAND gate can be used as an enabling inverter with one input serving as an active high enable input and the other used as the logical input.

7. The circuit as recited in claim 1 wherein the sensing inverter is CMOS NOR gate since the two-input CMOS NOR gate can be used as an enabling inverter with one input serving as an active low enable input and the other used as the logical input.

8. The circuit as recited in claim 1 wherein the Z-state circuit is simple Z-state circuit if the gate terminal of the lower PMOS transistor is coupled to power supply by replacing the CMOS NAND gate by an inverter.

9. The circuit as recited in claim 1 wherein the output of the Z-state circuit is coupled to the output of the filter connected between the output and ground.

10. The circuit as recited in claim 9 wherein the output of the Z-state circuit is at ground to ensure that no current flows into the circuit when the power-down input is at the power supply.

11. The circuit as recited in claim 9 wherein the gate terminal of the upper PMOS transistors is coupled to the output of the CMOS NAND gate while the gate terminal of the lower PMOS transistor is coupled to the output of a power-down inverter.

12. The circuit as recited in claim 9 wherein the sensing inverter is an odd number of sensing inverters coupled between the output of the Z-state circuit and the logical input of the CMOS NAND gate.

13. The circuit as recited in claim 1 wherein the output of the Z-state circuit is coupled to the output of the filter connected between the output and power supply.

14. The circuit as recited in claim 13 wherein the output of the Z-state circuit is at power supply to ensure that no current flows into the p-type power-down enable Z-state circuit when the power-down input is at the power supply.

15. The circuit as recited in claim 13 wherein the gate terminal of the lower PMOS transistors is coupled to the output of the CMOS NAND gate while the gate terminal of the upper PMOS transistor is coupled to the output of a power-down inverter.

16. The circuit as recited in claim 13 wherein the sensing inverter is an even number of sensing inverters coupled between the output of the Z-state circuit and the logical input of the CMOS NAND gate.

17. The circuit as recited in claim 16 wherein the CMOS NAND gate functions as the sensing inverter if the number of sensing inverters is null.

18. The circuit as recited in claim 1 wherein the CMOS NAND gate consists of two PMOS transistors and two NMOS transistors, wherein the gate terminal of each PMOS transistor is connected to the gate terminal of a separate NMOS transistor, with these device pair connections serving as inputs to the CMOS NAND gate circuit.

19. The circuit as recited in claim 18 wherein either of these device pair connections serves as the logical input to the CMOS NAND gate circuit.

20. The circuit as recited in claim 1 wherein the Z-state circuit is applied to all types of phase-locked loops without regard to architecture, topology, and schematics.

* * * * *